(12) United States Patent
Chen et al.

(10) Patent No.: US 12,334,389 B2
(45) Date of Patent: *Jun. 17, 2025

(54) MANUFACTURING METHOD OF SEMICONDUCTOR DEVICE

(71) Applicant: Taiwan Semiconductor Manufacturing Company, Ltd., Hsinchu (TW)

(72) Inventors: Chi-Ming Chen, Hsinchu County (TW); Kuei-Ming Chen, New Taipei (TW); Po-Chun Liu, Hsinchu (TW); Chung-Yi Yu, Hsin-Chu (TW); Chia-Shiung Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/423,137

(22) Filed: Jan. 25, 2024

(65) Prior Publication Data

US 2024/0170326 A1    May 23, 2024

Related U.S. Application Data

(63) Continuation of application No. 17/461,991, filed on Aug. 30, 2021, now Pat. No. 11,923,237.

(51) Int. Cl.
*H01L 21/76* (2006.01)
*H01L 21/762* (2006.01)
*H01L 21/768* (2006.01)

(52) U.S. Cl.
CPC .. *H01L 21/76254* (2013.01); *H01L 21/76256* (2013.01); *H01L 21/76877* (2013.01)

(58) Field of Classification Search
None
See application file for complete search history.

(56) References Cited

U.S. PATENT DOCUMENTS

| | | | |
|---|---|---|---|
| 11,923,237 B2 * | 3/2024 | Chen | H01L 23/5286 |
| 2004/0178406 A1 * | 9/2004 | Chu | H01L 27/092 257/E21.127 |
| 2007/0164417 A1 * | 7/2007 | Todd | G01J 5/024 257/E27.137 |

(Continued)

OTHER PUBLICATIONS

High Performance Strained-Si p-MOSFETs on SiGe-on-Insulator Substrates Fabricated by Simox Technology (Year: 1999).*

*Primary Examiner* — Bradley Smith
(74) *Attorney, Agent, or Firm* — JCIPRNET

(57) ABSTRACT

A manufacturing method of a semiconductor device includes at least the following steps. A sacrificial substrate is provided. An etch stop layer is formed on the sacrificial substrate. A portion of the etch stop layer is oxidized to form an oxide layer between the sacrificial substrate and the remaining etch stop layer. A capping layer is formed on the remaining etch stop layer. A device layer is formed on the capping layer. A first etching process is performed to remove the sacrificial substrate. A second etching process is performed to remove the oxide layer. A third etching process is performed to remove the remaining etch stop layer. A power rail is formed on the capping layer opposite to the device layer.

20 Claims, 18 Drawing Sheets

(56) References Cited

U.S. PATENT DOCUMENTS

2008/0003785 A1* 1/2008 Yokokawa ........ H01L 21/02694
          257/E21.12
2009/0026495 A1* 1/2009 Chu .................... H01L 21/2007
          257/190
2020/0172808 A1* 6/2020 Bjelopavlic ............ C09K 13/08

* cited by examiner

MANUFACTURING METHOD OF SEMICONDUCTOR DEVICE

CROSS-REFERENCE TO RELATED APPLICATION

This application is a continuation application of and claims the priority benefit of a prior application Ser. No. 17/461,991, filed on Aug. 30, 2021. The entirety of the above-mentioned patent application is hereby incorporated by reference herein and made a part of this specification.

BACKGROUND

Conventional silicon-on-insulator (SOI) CMOS devices typically have a thin layer of silicon, also known as the active layer, on an insulator layer such as a buried oxide (BOX) layer. Active devices, such as MOS transistors (MOSFETs), are formed in active regions within the active layer. Active devices in the active regions are isolated from the substrate by the BOX layer. SOI substrates are particularly useful in reducing problems relating to reverse body effects, device latch-up, soft-error rates, and junction capacitance. SOI technology therefore enables higher speed performance, higher packing density, and reduced power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
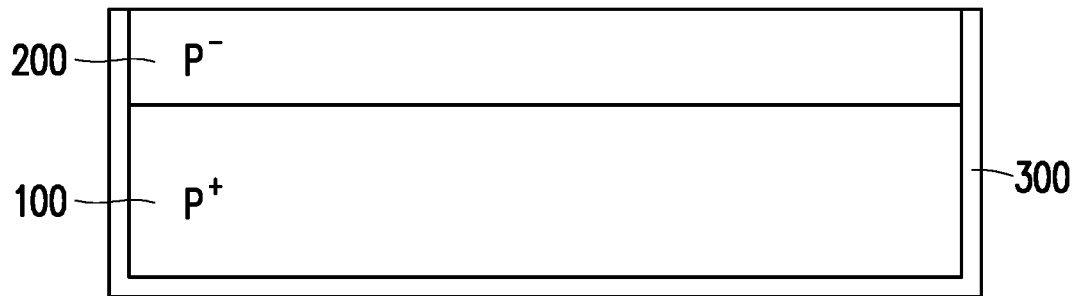
FIG. 1A to FIG. 1K are schematic cross-sectional views illustrating a manufacturing process of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1K are schematic cross-sectional views illustrating a manufacturing process of a semiconductor device 10 in accordance with some embodiments of the disclosure. Referring to FIG. 1A, a sacrificial substrate 100 is provided. In some embodiments, the sacrificial substrate 100 includes semiconductor materials. For example, the sacrificial substrate 100 includes silicon. In some embodiments, the sacrificial substrate 100 includes single-crystalline silicon. In some alternative embodiments, the sacrificial substrate 100 includes polycrystalline silicon. In some embodiments, the sacrificial substrate 100 is heavily doped with a dopant. For example, the sacrificial substrate 100 is doped with p-type dopants, such as boron or $BF_2$. That is, in some embodiments, the sacrificial substrate 100 is referred to as a $P^+$ silicon wafer.

In some embodiments, the sacrificial substrate 100 is subsequently subjected to operations of epitaxy and/or oxidation, and is completely removed during further thinning operation. Therefore, the sacrificial substrate 100 can be a very cheap wafer with lower grade. For example, the sacrificial substrate 100 is a test wafer or even a mechanical wafer.

In some embodiments, the sacrificial substrate 100 has a defect-free top surface to enable high quality epitaxial growth thereon and has a low-warpage property to sustain the subsequent bonding operation.

In some embodiments, the sacrificial substrate 100 has a very wide range of doping level. For example, the doping concentration ranges from about $1 \times 18$ $cm^{-3}$ to $1 \times 20$ $cm^{-3}$. The lower end of the doping concentration, which would result in about 0.1 Ohm-cm in wafer resistivity, is chosen for keeping high etch rate in removal of the sacrificial substrate 100 in the subsequent processes. The higher end of the doping concentration, which would result in about $10^{-3}$ Ohm-cm resistivity, is determined in accordance with the ability to grow a defect-free epitaxial layer thereon.

As illustrated in FIG. 1A, an epitaxial layer 200 is formed on the sacrificial substrate 100. In some embodiments, the epitaxial layer 200 is epitaxially grown on the sacrificial substrate 100. In some embodiments, the epitaxial conditions, such as temperature, feed gases, and the like, are chosen to provide high quality (e.g., defect-free) epitaxial film and high throughput. Similar to the sacrificial substrate 100, the epitaxial layer 200 also includes semiconductor materials. For example, the epitaxial layer 200 includes silicon. In some embodiments, the epitaxial layer 200 includes single-crystalline silicon. In some alternative embodiments, the epitaxial layer 200 includes polycrystalline silicon. In some embodiments, the epitaxial layer 200 is lightly doped with a dopant. For example, the epitaxial layer 200 is doped with p-type dopants, such as boron or $BF_2$. That is, in some embodiments, the epitaxial layer 200 is referred to as a $P^-$ silicon layer. In some embodiments, the sacrificial substrate 100 and the epitaxial layer 200 are of the same conductivity type. In some embodiments, the sacrificial substrate 100 has a doping concentration greater than that of the epitaxial layer 200.

In some embodiments, an oxide layer 300 is formed on the sacrificial substrate 100 and the epitaxial layer 200. In some embodiments, the oxide layer 300 is formed to partially wrap the sacrificial substrate 100 and the epitaxial layer 200. For example, the oxide layer 300 is formed to cover a bottom surface and sidewalls of the sacrificial substrate 100. Meanwhile, the oxide layer 300 also covers sidewalls of the epitaxial layer 200. As illustrated in FIG. 1A, the oxide layer 300 does not cover a top surface of the epitaxial layer 200. In other words, at this stage, the top surface of the epitaxial layer 200 is exposed.

In some embodiments, the oxide layer 300 is formed by oxidizing the sacrificial substrate 100 and the epitaxial layer 200. For example, the bottom surface of the sacrificial substrate 100, the sidewalls of the sacrificial substrate 100, and the sidewalls of the epitaxial layer 200 are oxidized to transform a portion of the sacrificial substrate 100 and a portion of the epitaxial layer 200 into the oxide layer 300. In some embodiments, the oxidation conditions are chosen to form high quality (e.g., defect-free) oxide and high quality interfaces between the oxide layer 300 and the sacrificial substrate 100 and between the oxide layer 300 and the epitaxial layer 200. In some embodiments, the oxidation process includes thermal oxidation, such as dry oxidation. In some embodiments, the sacrificial substrate 100 and the epitaxial layer 200 are thermally oxidized to a thickness equal to a desired buried oxide (BOX) thickness, such as between about 20 nm and 200 nm. However, the disclosure is not limited thereto. In some alternative embodiments, the BOX thickness of more than 200 nm is desired. As mentioned above, the sacrificial substrate 100 and the epitaxial layer 200 includes silicon. Therefore, the oxide layer 300 may include $SiO_2$. It should be noted that the formation method of the oxide layer 300 is not limited to the oxidation process. In some alternative embodiments, the oxide layer 300 is formed by depositing an oxide material on the sacrificial substrate 100 and the epitaxial layer 200 without consuming the sacrificial substrate 100 and the epitaxial layer 200. In some embodiments, the oxide material includes $SiO_2$ or other suitable oxides. In some embodiments, the oxide layer 300 is deposited by chemical vapor deposition (CVD), physical vapor deposition (PVD), atomic layer deposition (ALD), or other suitable methods. In some embodiments, the oxide layer 300 may sufficiently prevent dopants (such as boron) or impurities to diffuse out from the sacrificial layer 100 and the epitaxial layer 200.

Figure 1B:
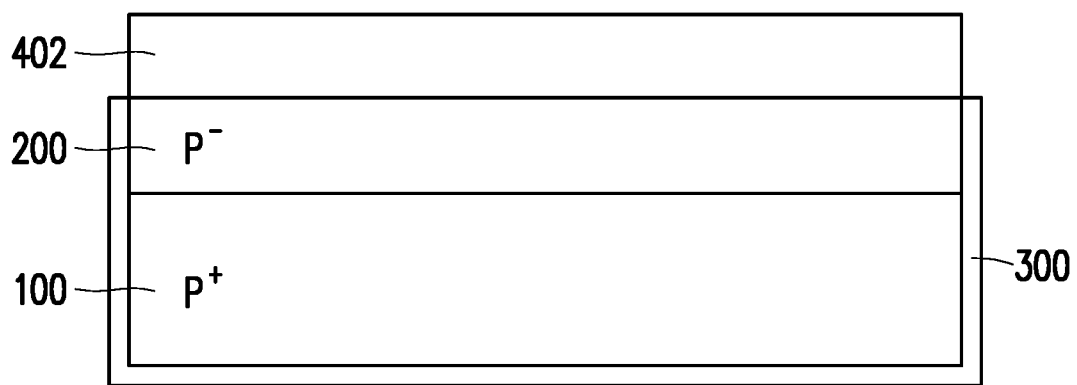

Referring to FIG. 1B, an etch stop layer 402 is formed on the epitaxial layer 200. In some embodiments, a material of the etch stop layer 402 includes SiGe:B. That is, the etch stop layer 402 is formed by depositing a SiGe:B layer onto the epitaxial layer 200. In some embodiments, the SiGe:B layer is deposited through an epitaxial deposition process. In some embodiments, the epitaxial deposition includes a selective epitaxial deposition process. That is, the etch stop layer 402 is deposited onto the epitaxial layer 200 and is not deposited onto the oxide layer 300. As illustrated in FIG. 1B, the etch stop layer 402 is directly in contact with the underlying epitaxial layer 200. In some embodiments, the etch stop layer 402 is in single-crystalline state. However, the disclosure is not limited thereto. In some alternative embodiments, the etch stop layer 402 may be in polycrystalline state.

Figure 1C:
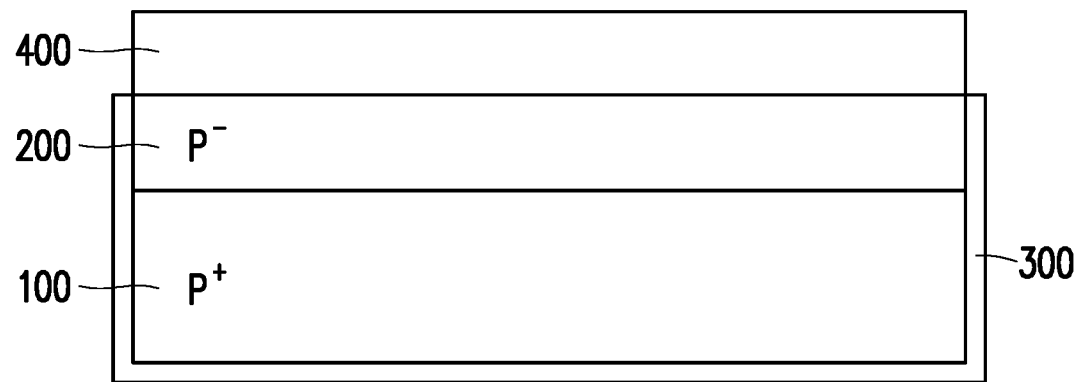

Referring to FIG. 1B and FIG. 1C, after the etch stop layer 402 is formed on the epitaxial layer 200, an ion implantation process IP1 is performed on the etch stop layer 402. In some embodiments, carbon atoms are implanted into the etch stop layer 402 through the ion implantation process IP1, so as to form an etch stop layer 400 overlying the epitaxial layer 200. In some embodiments, the etch stop layer 400 is made of SiGeC:B. In some embodiments, an implantation energy of the ion implantation process IP1 ranges from about 5 keV to about 100 keV. In some embodiments, a content of the carbon in the etch stop layer 400 ranges from about 0.5% to about 2.0% and a content of the germanium in the etch stop layer 400 ranges from about 25% to about 30%. On the other hand, a concentration of the boron in the etch stop layer 400 ranges from about $1\times10^{20}$ atoms/cm$^3$ to about $3\times10^{20}$ atoms/cm$^3$.

Although FIG. 1B and FIG. 1C illustrated that the carbon atoms are implanted after the etch stop layer 402 made of SiGe:B is formed, the disclosure is not limited thereto. In some alternative embodiments, the carbon atoms may be introduced during the epitaxial deposition process of the etch stop layer 402. That is, upon completion of the formation of the etch stop layer 402, the etch stop layer 402 already includes SiGeC:B.

Figure 1D:
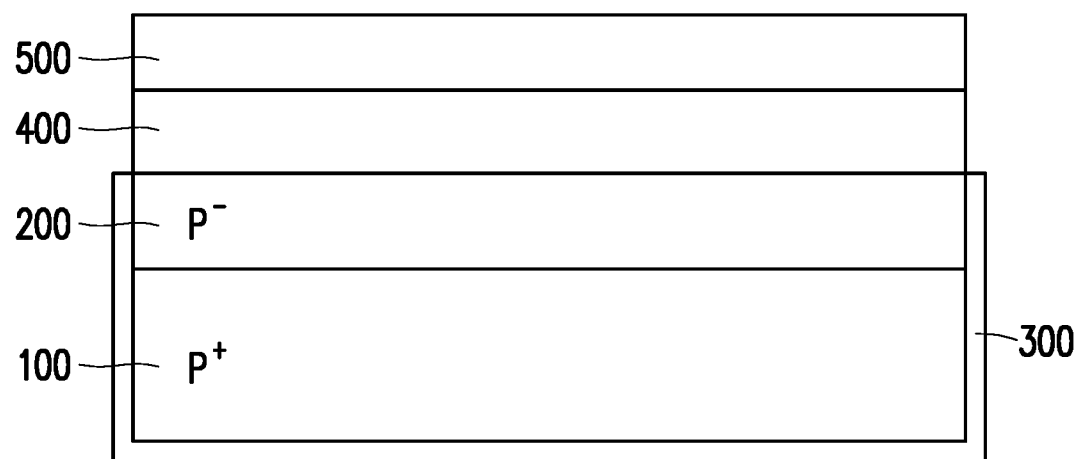

Referring to FIG. 1D, a capping layer 500 is formed on the etch stop layer 400. In some embodiments, a material of the capping layer 500 includes elementary semiconductor materials, such as silicon, germanium, gallium, arsenic, or the like. However, the disclosure is not limited thereto. In some alternative embodiments, the material of the capping layer 500 includes an alloy semiconductor such as silicon germanium, silicon germanium carbide, gallium arsenic phosphide, gallium indium phosphide, or the like. In some embodiments, the capping layer 500 further includes other features such as various doped regions, a buried layer, and/or an epitaxy layer. For example, the capping layer 500 includes various doped regions (e.g., p-type wells or n-type wells) depending on design requirements. The doped regions are doped with p-type dopants, such as boron or BF2, and/or n-type dopants, such as phosphorus or arsenic. Moreover, the doped regions may be formed directly on the capping layer 500, in a P-well structure, in an N-well structure, in a dual-well structure, or using a raised structure. In some embodiments, the structure illustrated in FIG. 1D is referred to as a silicon-on-insulator (SOI) substrate.

Figure 1E:
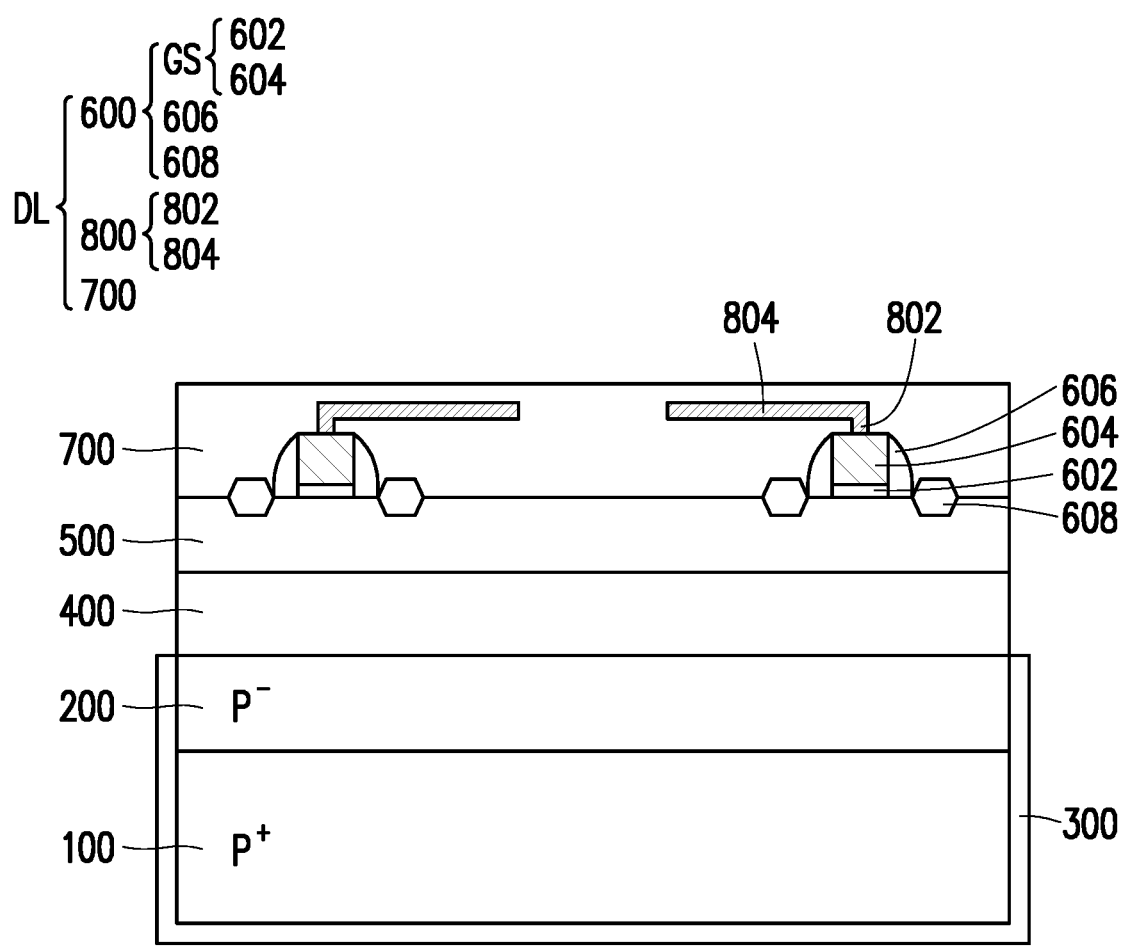

Referring to FIG. 1E, a plurality of transistors 600 is formed over the capping layer 500. In some embodiments, each transistor 600 includes a gate structure GS, a pair of spacers 606, and source/drain (S/D) regions 608. In some embodiments, the gate structure GS includes a gate dielectric layer 602 and a gate electrode 604. The gate dielectric layer 602 and the gate electrode 604 are formed on the capping layer 500 in sequential order from bottom to top. The gate dielectric layer 602 includes silicon oxide, silicon nitride, silicon oxynitride, high-k dielectric materials, or a combination thereof. It should be noted that the high-k dielectric materials are generally dielectric materials having a dielectric constant greater than 4. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. In some embodiments, the gate dielectric layer 602 is formed using a suitable process such CVD, PVD, ALD, flowable chemical vapor deposition (FCVD), thermal oxidation, UV-ozone oxidation, or a combination thereof.

As illustrated in FIG. 1E, the gate electrode 604 is formed on the gate dielectric layer 602. In some embodiments, the gate electrode 604 is formed by depositing a metal material through suitable processes such as ALD, CVD, PVD, plating, or a combination thereof. In some embodiments, the gate electrode 604 include TiN, WN, TaN, Ru, Ti, Ag, Al, TiAl, TiAlN, TaC, TaCN, TaSiN, Mn, or Zr. Although not illustrated, the gate electrodes 604 may be a multi-layered structure. In other words, in some embodiments, the gate electrode 604 includes a barrier, a work function layer, or a combination thereof.

In some embodiments, the spacers 606 are formed aside the gate structure GS. For example, the spacers 606 are formed over sidewalls of the gate dielectric layer 602 and sidewalls of the gate electrode 604. The spacers 606 are formed of silicon oxide, silicon nitride, silicon oxynitride, silicon carbide, fluoride-doped silicate glass (FSG), low-k dielectric materials, or a combination thereof. It should be noted that the low-k dielectric materials are generally dielectric materials having a dielectric constant lower than 3.9. The spacers 606 may have a multi-layer structure which includes one or more liner layers. The liner layer includes a dielectric material such as silicon oxide, silicon nitride, and/or other suitable materials. The formation of the spacers 606 can be achieved by depositing suitable dielectric material and anisotropically etching off the dielectric material.

As mentioned above, the capping layer 500 may include various doped regions. In some embodiments, these doped regions serve as the S/D regions 608 of the transistors 600. In some embodiments, the S/D regions 608 are doped with p-type dopants. However, the disclosure is not limited thereto. In some alternative embodiments, the S/D regions 608 are doped with n-type dopants. In some embodiments, part of the capping layer 500 is removed through etching or other suitable processes and the dopants are formed in the hollowed area through epitaxy growth. For example, the epitaxial layers including SiGe, SiC, or other suitable materials form the S/D regions 608. However, the disclosure is not limited thereto. In some alternative embodiments, the dopant are doped into the S/D regions 608 through ion implantation.

In some embodiments, the capping layer 500 further includes isolation regions (not shown), which are formed to isolate adjacent transistors 600. The isolation regions utilize isolation technology, such as local oxidation of silicon (LOCOS) or shallow trench isolation (STI) to electrically isolate various regions. In some embodiments, the isolation region includes silicon oxide, silicon nitride, silicon oxynitride, other suitable materials, or a combination thereof.

As illustrated in FIG. 1E, the transistors 600 are planar metal-oxide semiconductor (MOS) transistors. However, the disclosure is not limited thereto. In some alternative embodiments, the transistors 600 may be Fin Field-Effect (FinFET) transistors or other types of transistors.

In some embodiments, during the formation of the transistors 600, the structure shown in FIG. 1E is subjected to various high temperature processes. For example, the process temperature for epitaxial growth of the source/drain regions 608 ranges from about 420° C. to about 500° C. The process temperature for processing the gate dielectric layer 602 through decoupled plasma nitridation (DPN) and/or post nitridation annealing (PNA) ranges from about 350° C. to about 650° C. The process temperature for further processing the transistor 600 through rapid thermal annealing (RTA) and flash annealing respective ranges from about 850° C. to about 950° C. and about 1050° C. to about 1150° C. Conventionally, these high temperature process would cause the boron atoms in the etch stop layer to diffuse into the adjacent epitaxial layer 200 and the adjacent capping layer 500, thereby causing degradation in the device performance.

However, as mentioned above, the etch stop layer 400 is implanted with carbon atoms. These carbon atoms are able to retard the diffusion of boron atoms out of the etch stop layer 400. That is, with the carbon atoms implanted in the etch stop layer 400, the boron atoms are trapped within the etch stop layer 400, and the problem of boron diffusion may be sufficiently eliminated. As such, the performance of the subsequently formed device may be ensured.

As illustrated in FIG. 1E, a dielectric layer 700 and contact patterns 800 are formed over the transistors 600. In some embodiments, the dielectric layer 700 is formed to encapsulate the transistors 600. The dielectric layer 700 includes, for example, silicon oxide, silicon oxynitride, carbon doped silicon oxide (e.g., SiCOH), and/or a combination thereof. In some embodiments, the dielectric layer 700 is formed to a suitable thickness by FCVD, CVD, high density plasma chemical vapor deposition (HDPCVD), sub-atmospheric chemical vapor deposition (SACVD), spin-on coating, or other suitable methods. For simplicity, the dielectric layer 700 is illustrated as one bulky layer in FIG. 1E, but it should be understood that the dielectric layer 700 may be constituted by multiple dielectric layers.

In some embodiments, the contact patterns 800 are embedded in the dielectric layer 700. In some embodiments, each contact pattern 800 includes a via pattern 802 and a routing pattern 804. As illustrated in FIG. 1E, the via pattern 802 extends vertically and the routing pattern 804 extends horizontally. That is, the via pattern 802 may be perpendicular to the routing pattern 804. In some embodiments, the via pattern 802 is connected to the routing pattern 804 at one end and is connected to the gate electrode 604 of the transistor 600 at another end. That is, the contact patterns 800 are electrically connected to the transistors 600. In some embodiments, the contact patterns 800 include metallic materials having excellent conductivity. For example, the contact patterns 800 include copper, tungsten, cobalt, alloys thereof, or a combination thereof.

In some embodiments, the transistors 600, the dielectric layer 700, and the contact patterns 800 are collectively referred to as a device layer DL. For example, as illustrated in FIG. 1E, the device layer DL is formed on the capping layer 500.

Figure 1F:
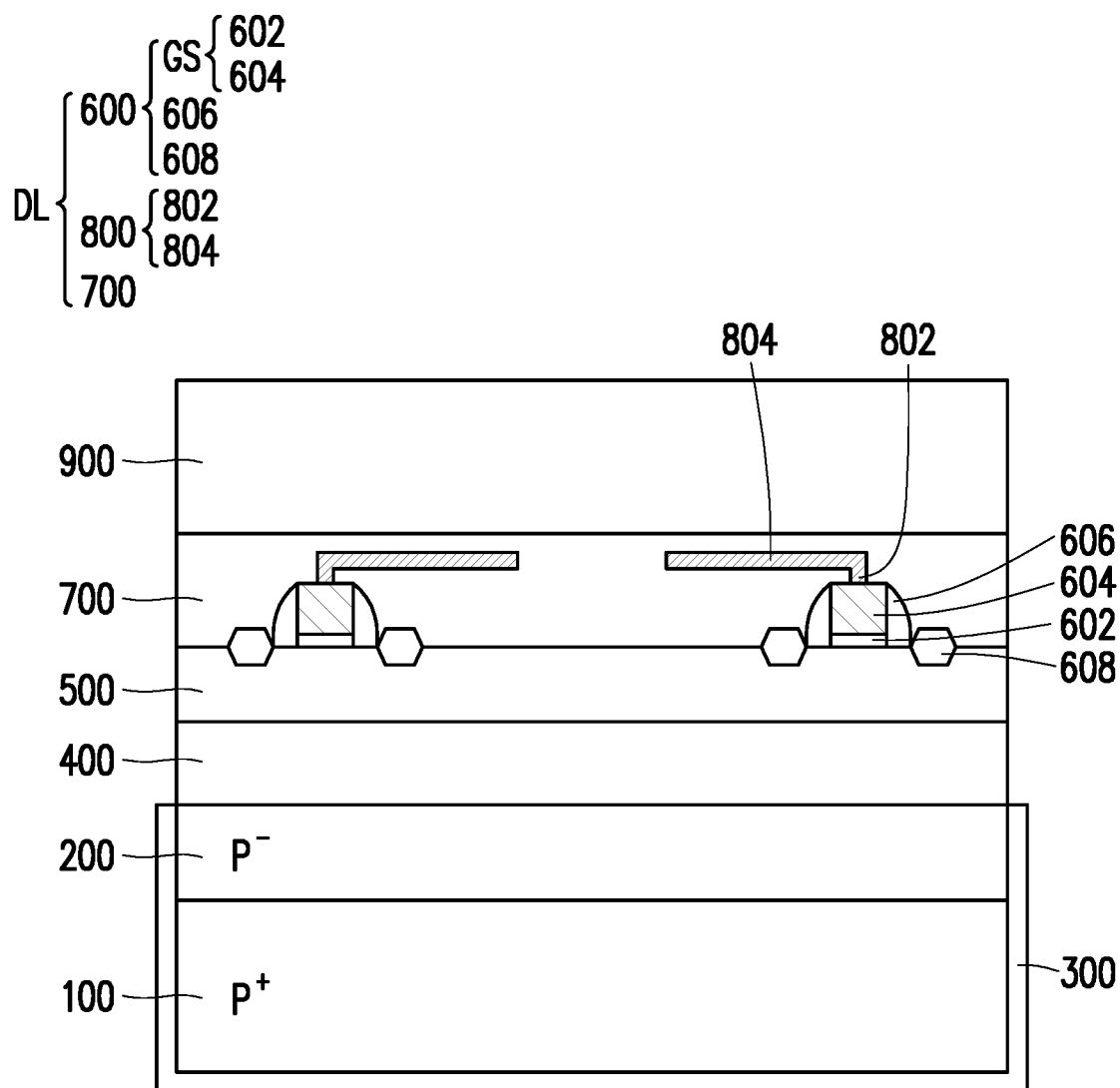

Referring to FIG. 1F, a handle substrate 900 is bonded to the device layer DL. For example, the handle substrate 900 is bonded to the dielectric layer 700. In some embodiments, the handle substrate 900 is bonded to the device layer DL through fusion bonding. Depending on future application, the handle substrate 900 may be a cheap mechanical support with bondability (e.g., low surface roughness and low warpage). In some embodiments, the handle substrate 900 is free of active components and passive components. In some embodiments, the handle substrate 900 is also free of wire routings. For example, the handle substrate 900 may be a blank substrate which purely functions as a supporting element without serving any signal transmission function. In some embodiments, the handle substrate 900 includes silicon. In some embodiments, the handle substrate 900 includes single-crystalline silicon. In some alternative embodiments, the handle substrate 900 includes polycrystalline silicon.

In some embodiments, before the bonding process, the substrates or wafers are cleaned from particles, organics, and metal contamination in a standard wet chemical RCA clean bath sequence, and then dried with Marangoni or a suitable process. In some embodiments, one or both substrates are processed in plasma to additionally activate the surfaces and thus improve bonding yield. Stay-alone plasma tools or plasma modules integrated in a bonding tool can be used.

Figure 1G:
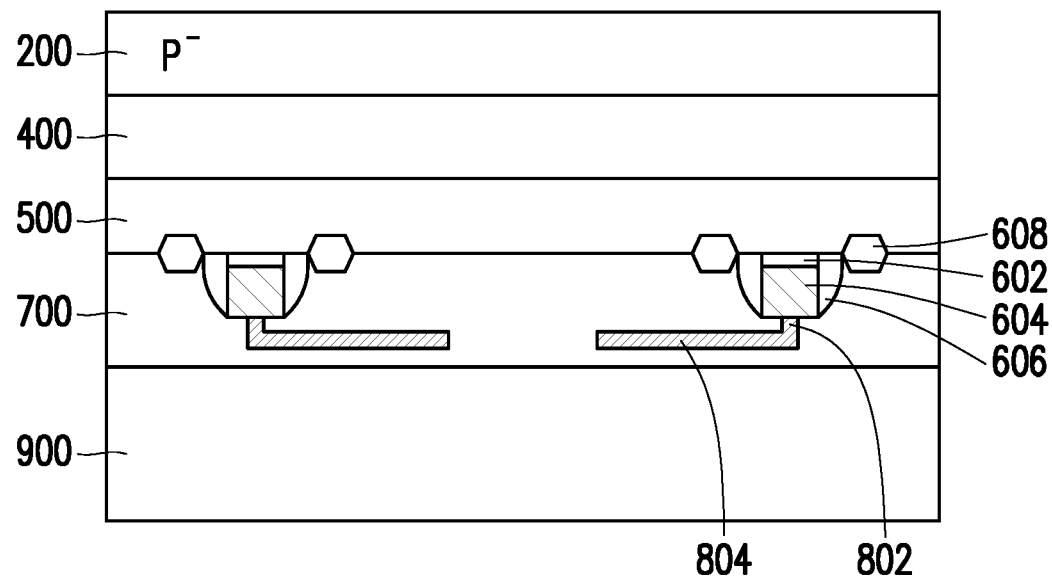

Referring to FIG. 1F and FIG. 1G, the structure illustrated in FIG. 1F is flipped upside down. Thereafter, the oxide layer 300 is removed. In some embodiments, the oxide layer 300 is removed by an etching process and/or a planarization process. The etching process includes, for example, an anisotropic etching process such as dry etch or an isotropic etching process such as wet etch. In some embodiments, an etchant for the wet etch includes diluted hydrofluoric acid (DHF) or the like. On the other hand, the dry etch includes, for example, reactive ion etch (RIE), inductively coupled plasma (ICP) etch, electron cyclotron resonance (ECR) etch, neutral beam etch (NBE), and/or the like. In some embodiments, the planarization process includes a mechanical grinding process and/or a chemical mechanical polishing (CMP) process.

After the oxide layer 300 is completely removed, a first etching process is performed on the sacrificial substrate 100 to remove the sacrificial substrate 100. In some embodiments, the first etching process includes a dry etch process or a wet etch process. The dry etch process includes, for example, RIE, ICP etch, ECR etch, NBE, and/or the like. When the first etching process is a wet etching process, an etchant for removing the sacrificial layer 100 includes a combination of hydrofluoric acid (HF), nitric acid ($HNO_3$), and acetic acid ($CH_3COOH$). That is, the first etching process is a hydrofluoric/nitric/acetic (HNA) etch. In some embodiments, the etchant for the first etching process has a first etch rate for materials of the sacrificial substrate 100 and a second etch rate for materials of the epitaxial layer 200. In some embodiments, the second etch rate is less than the first etch rate. For example, the first etch rate is about 90 to about 100 times greater than the second etch rate. As such, the epitaxial layer 200 may serve as an etch stop layer for the first etching process. That is, the sacrificial substrate 100 may be completely removed while the epitaxial layer 200 is barely damaged.

Figure 1H:
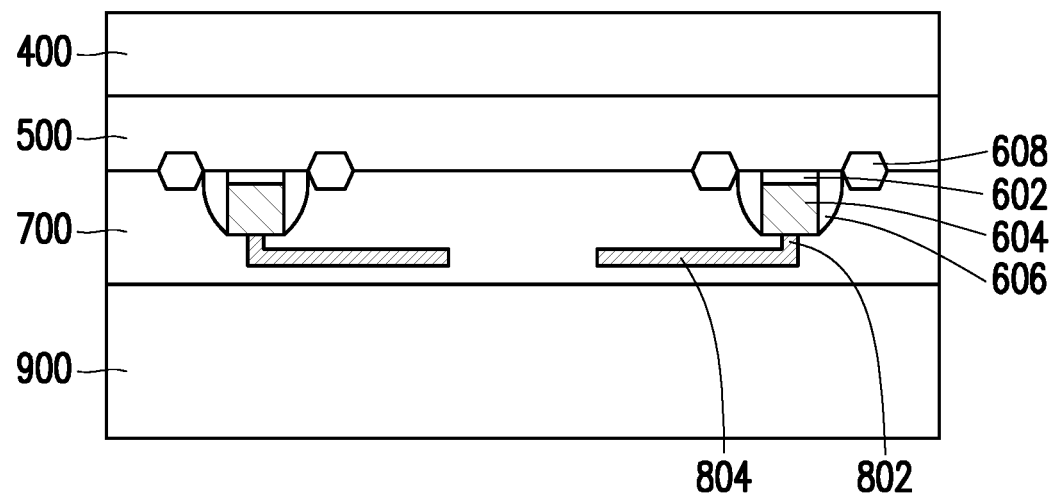

Referring to FIG. 1G and FIG. 1H, a second etching process is performed on the epitaxial layer 200 to remove the epitaxial layer 200. In some embodiments, the second etching process includes a dry etch process or a wet etch process. The dry etch process includes, for example, RIE, ICP etch, ECR etch, NBE, and/or the like. When the second etching process is a wet etching process, an etchant for removing the epitaxial layer 200 includes tetramethylammonium hydroxide (TMAH). In some embodiments, the etchant for the second etching process has a third etch rate for materials of the epitaxial layer 200 and a fourth etch rate for materials of the etch stop layer 400. In some embodiments, the fourth etch rate is less than the third etch rate. For example, the third etch rate is about 90 to about 100 times greater than the fourth etch rate. As such, the etch stop layer 400 may serve as an etch stop layer for the second etching process. That is, the epitaxial layer 200 may be completely removed while the etch stop layer 400 is barely damaged.

Figure 1I:
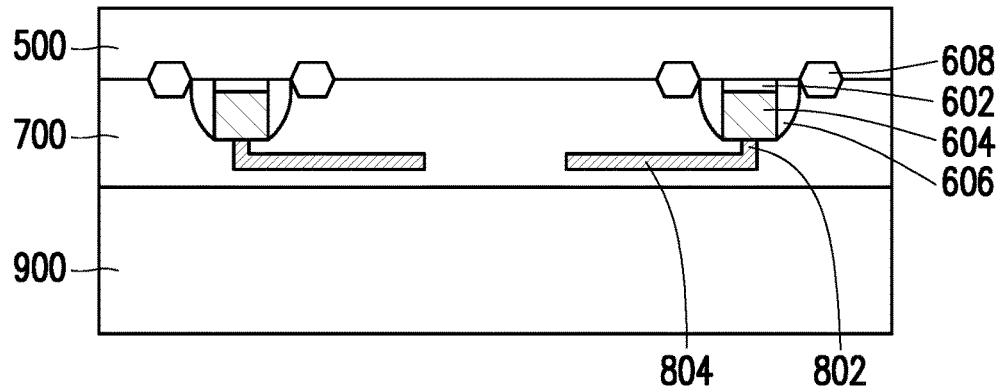

Referring to FIG. 1H and FIG. 1I, a third etching process is performed on the etch stop layer 400 to remove the etch stop layer 400. In some embodiments, the third etching process includes a dry etch process or a wet etch process. The dry etch process includes, for example, RIE, ICP etch, ECR etch, NBE, and/or the like. When the third etching process is a wet etching process, an etchant for removing the etch stop layer 420 includes a combination of hydrofluoric acid, hydrogen peroxide ($H_2O_2$), and acetic acid. In some embodiments, the etchant for the third etching process has a fifth etch rate for materials of the etch stop layer 400 and a sixth etch rate for materials of the capping layer 500. In some embodiments, the sixth etch rate is less than the fifth etch rate. For example, the fifth etch rate is about 50 to about 100 times greater than the sixth etch rate. As such, the capping layer 500 may serve as an etch stop layer for the third etching process. That is, the etch stop layer 420 may be completely removed while the capping layer 500 is barely damaged.

In some embodiments, by adopting the three-step etching process with different etchants, the removal of the sacrificial layer 100, the epitaxial layer 200, and the etch stop layer 400 can be highly controlled. Therefore, the thickness of the capping layer 500 may be highly uniform across the capping layer 500 and a total thickness variation (TTV) of the capping layer 500 may be low. In some embodiments, the TTV of the capping layer 500 ranges from about 500 to about 1500 angstroms. That is, a top surface of the capping layer 500 as shown in FIG. 1I is substantially flat.

Figure 1J:
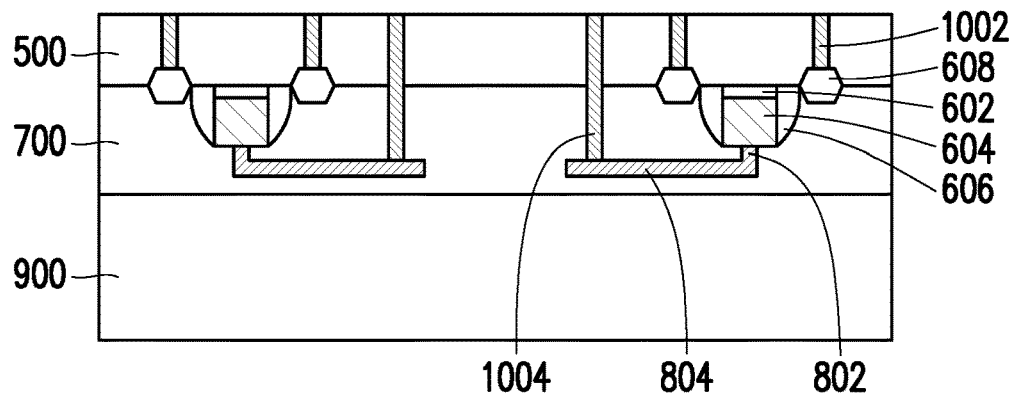

Referring to FIG. 1J, a plurality of conductive contacts 1002 is formed in the capping layer 500. In some embodiments, the conductive contacts 1002 are embedded in the capping layer 500. For example, the conductive contacts 1002 penetrate through the capping layer 500 to be in direct contact with the source/drain regions 608 of the transistors 600. In other words, the conductive contacts 1002 are electrically connected to the source/drain regions 608 of the transistors 600.

As illustrated in FIG. 1J, a plurality of conductive contacts 1004 are formed in the capping layer 500 and the dielectric layer 700. In some embodiments, the conductive contacts 1004 are embedded in the capping layer 500 and the dielectric layer 700. For example, the conductive contacts 1004 penetrate through the capping layer 500 and further extend into the dielectric layer 700 to be in direct contact with the routing patterns 804 of the contact patterns 800. As mentioned above, the contact patterns 800 is electrically connected to the gate electrodes 604 of the transistors 600. Therefore, the conductive contacts 1004 are electrically connected to the transistors 600 through the contact patterns 800.

In some embodiments, materials of the conductive contacts 1002, 1004 are the same as the material of the contact patterns 800. However, the disclosure is not limited thereto. In some alternative embodiments, the conductive contacts 1002, 1004 and the contact patterns 800 may be made of different materials. In some embodiments, the conductive contacts 1002, 1004 include metallic materials having excellent conductivity. For example, the conductive contacts 1002, 1004 include copper, tungsten, cobalt, alloys thereof, or a combination thereof.

Figure 1K:
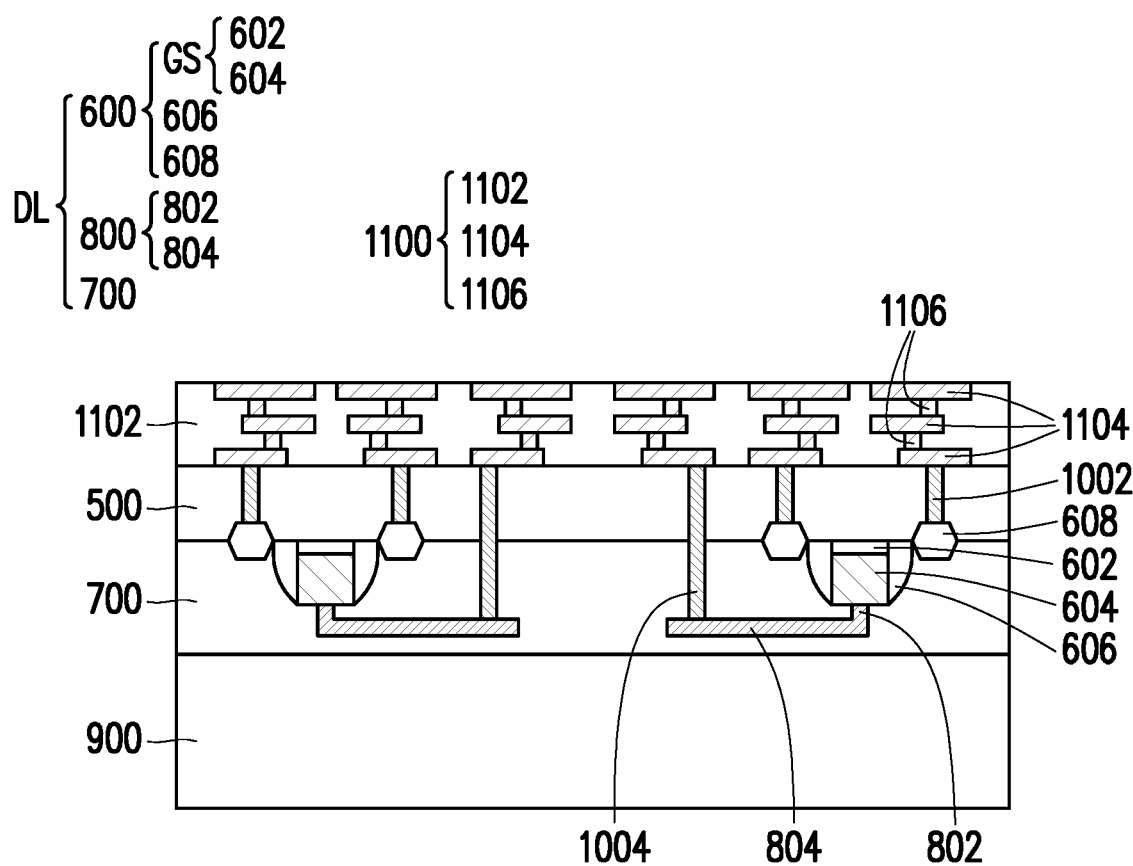

Referring to FIG. 1K, a power rail 1100 is formed on the capping layer 500 opposite to the device layer DL to obtain a semiconductor device 10. In some embodiments, the power rail 1100 includes a dielectric layer 1102, a plurality of conductive patterns 1104, and a plurality of conductive vias 1106. For simplicity, the dielectric layer 1102 is illustrated as a single dielectric layer and the conductive patterns 1104 are illustrated as embedded in the dielectric layer 1104. Nevertheless, from the perspective of the manufacturing process, the dielectric layer 1102 is constituted by at least two dielectric layers, and the conductive patterns 1104 are sandwiched between two adjacent dielectric layers. In some embodiments, the conductive patterns 1104 located at different level heights are connected to each other through the conductive vias 1106. In other words, the conductive patterns 1104 are electrically connected to each other through the conductive vias 1106.

In some embodiments, the dielectric layer 1102 includes silicon oxide, silicon oxynitride, carbon doped silicon oxide (e.g., SiCOH), and/or a combination thereof. However, the disclosure is not limited thereto. In some alternative embodiments, the dielectric layer 1102 includes polyimide, epoxy resin, acrylic resin, phenol resin, benzocyclobutene (BCB), polybenzooxazole (PBO), or any other suitable polymer-based dielectric material. The dielectric layer 1102, for example, may be formed by suitable fabrication techniques such as spin-on coating, CVD, PECVD, or the like. In some embodiments, materials of the conductive patterns 1104 and the conductive vias 1106 include aluminum, titanium, copper, nickel, tungsten, or alloys thereof. The conductive patterns 1104 and the conductive vias 1106 may be formed by electroplating, deposition, and/or photolithography and etching. In some embodiments, the conductive patterns 1104 and the underlying conductive vias 1106 may be formed simultaneously. It should be noted that the number of the dielectric layers 1102, the number of the conductive patterns 1104, and the number of the conductive vias 1106 illustrated in FIG. 1K are merely for illustrative purposes, and the disclosure is not limited thereto. In some alternative embodiments, fewer or more layers of the dielectric layers 1102, the conductive patterns 1104, or the conductive vias 1106 may be formed depending on the circuit design.

As illustrated in FIG. 1K, the power rail 1102 is electrically connected to the device layer DL through the conductive contacts 1002, 1004. For example, the conductive contacts 1002 electrically connect the conductive patterns 1104 of the power rail 1100 and the source/drain regions 608 of the transistors 600. Meanwhile, the conductive contacts 1004 electrically connect the conductive patterns 1104 of the power rail 1100 and the gate structures GS of the transistors 600. In some embodiments, the power rail 1100 is used as a ground or a power source for the transistors 600.

Figure 2A:
FIG. 2A to FIG. 2M are schematic cross-sectional views illustrating a manufacturing process of a semiconductor device in accordance with some alternative embodiments of the disclosure.

FIG. 2A to FIG. 2M are schematic cross-sectional views illustrating a manufacturing process of a semiconductor device 20 in accordance with some alternative embodiments of the disclosure. Referring to FIG. 2A, a sacrificial substrate 100' is provided. In some embodiments, the sacrificial substrate 100' includes semiconductor materials. For example, the sacrificial substrate 100' includes silicon. In some embodiments, the sacrificial substrate 100' includes single-crystalline silicon. In some alternative embodiments, the sacrificial substrate 100' includes polycrystalline silicon. In some embodiments, the sacrificial substrate 100' is lightly doped with a dopant. For example, the sacrificial substrate 100' is doped with p-type dopants, such as boron or $BF_2$. That is, in some embodiments, the sacrificial substrate 100' is referred to as a $P^-$ silicon wafer. In some embodiments, the sacrificial substrate 100' is completely removed during further thinning operation. Therefore, the sacrificial substrate 100' can be a very cheap wafer with lower grade. For example, the sacrificial substrate 100' is a test wafer or even a mechanical wafer.

Figure 2B:
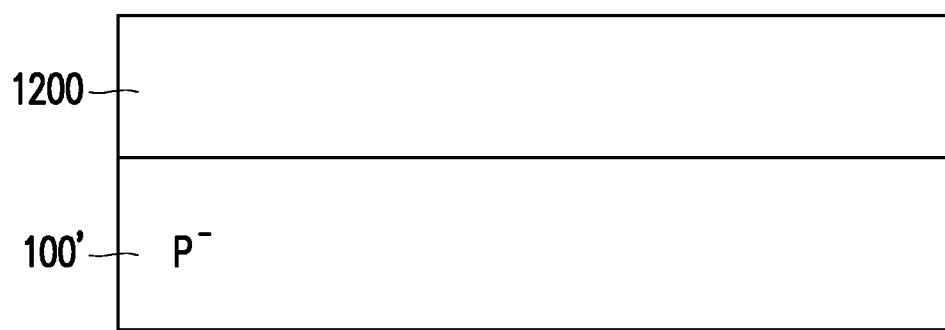

Referring to FIG. 2B, an etch stop layer 1200 is formed on the sacrificial substrate 100'. In some embodiments, a material of the etch stop layer 1200 includes SiGe. That is, the etch stop layer 1200 is formed by depositing a SiGe layer onto the sacrificial substrate 100'. In some embodiments, the SiGe layer is deposited through an epitaxial deposition process. In some embodiments, the epitaxial deposition includes a selective epitaxial deposition process. In some embodiments, the etch stop layer 1200 is formed to a thickness of about 30 nm to about 100 nm. In some embodiments, a content of germanium in the etch stop layer 1200 ranges from about 20% to about 30%. As illustrated in FIG. 2B, the etch stop layer 1200 is directly in contact with the underlying sacrificial substrate 100'. In some embodiments, the etch stop layer 1200 is in single-crystalline state. However, the disclosure is not limited thereto. In some alternative embodiments, the etch stop layer 1200 may be in polycrystalline state.

Figure 2C:
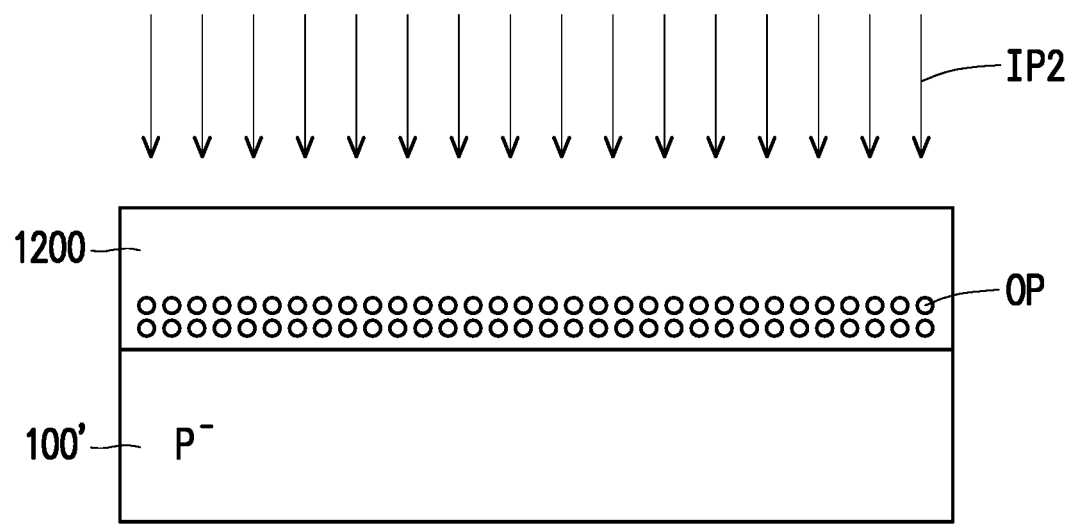

Referring to FIG. 2C, after the etch stop layer 1200 is formed on the sacrificial substrate 100', an ion implantation process IP2 is performed on the etch stop layer 1200. In some embodiments, oxygen atoms OP are implanted into the etch stop layer 1200 through the ion implantation process IP2. In some embodiments, the oxygen atoms OP are implanted into the etch stop layer 1200 with a deep depth along the thickness direction such that the oxygen atoms OP are located closer to a bottom surface of the etch stop layer 1200 than a top surface of the etch stop layer 1200. However, the oxygen atoms OP do not reach the bottom surface of the etch stop layer 1200. That is, after the ion implantation process IP2, the sacrificial substrate 100' is spaced apart from the oxygen atoms OP implanted into the etch stop layer 1200. In some embodiments, an implantation energy of the ion implantation process IP2 ranges from about 5 keV to about 100 keV. In some embodiments, a doping concentration of the oxygen atoms OP ranges from about $1 \times 10^{17}$ cm$^{-3}$ to about $3 \times 10^{17}$ cm$^{-3}$. At this stage, the oxygen atoms OP are randomly dispersed in the lower portion of the etch stop layer 1200.

Figure 2D:
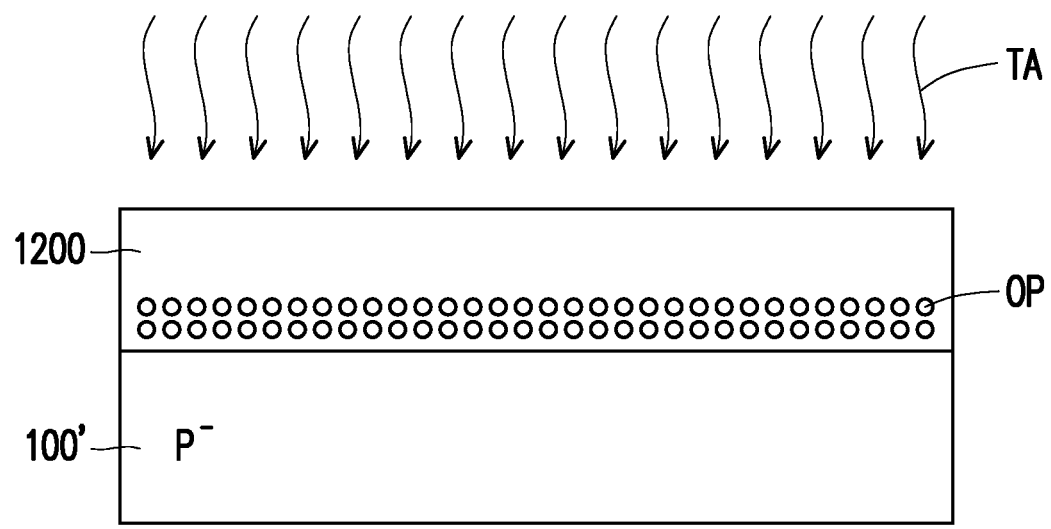
Figure 2E:
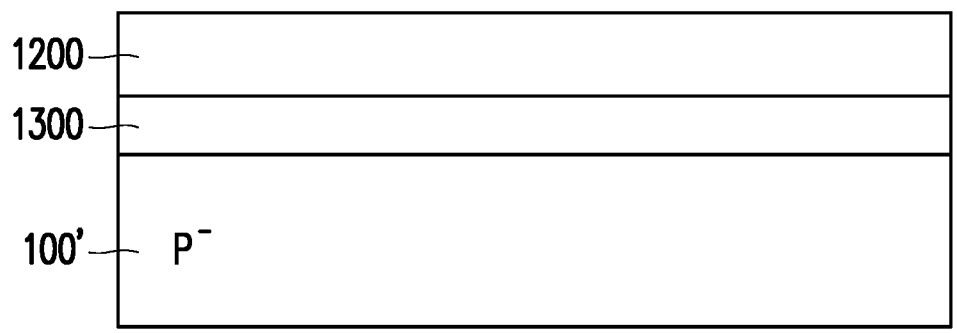
Figure 3:
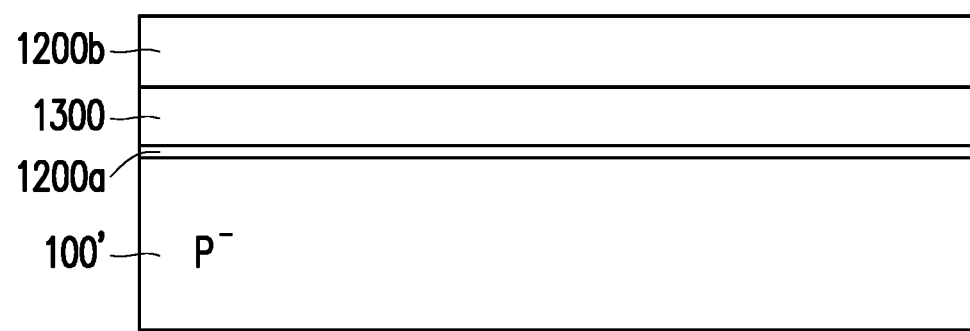
FIG. 3 is a schematic cross-sectional view illustrating an intermediate stage of a manufacturing process of the semiconductor device in accordance with some alternative embodiments of the disclosure.

Referring to FIG. 2D and FIG. 2E, a thermal annealing process TA is performed on the doped etch stop layer 1200 to transform a portion (i.e. the lower portion) of the etch stop layer 1200 into an oxide layer 1300. In some embodiments, the thermal annealing process TA is performed at a temperature ranging from about 1200° C. to about 1300° C. In some embodiments, a duration of the thermal annealing process TA ranges from about 5 hours to about 8 hours. In some embodiments, the structure shown in FIG. 2D is placed in a chamber filled with nitrogen gas and the thermal annealing process TA is performed in the nitrogen environment. In some embodiments, the oxide layer 1300 includes $SiO_2$. In some embodiments, after the thermal annealing process TA is performed, SiGe in the remaining etch stop layer 1200 is in a fully relaxed stated. As mentioned above, the etch stop layer 1200 includes germanium. In some embodiments, the germanium atoms in the etch stop layer 1200 would push the oxygen atoms OP doped in the etch stop layer 1200 during the thermal annealing process TA, thereby allowing the oxide layer 1300 formed to have smooth surfaces. In other words, the germanium atoms allow the oxide layer 1300 formed to be self-aligned. For example, a smooth interface can be seen between the oxide layer 1300 and the remaining etch stop layer 1200. In some embodiments, the oxygen atoms OP may be further pushed down by germanium atoms during the thermal annealing process TA to reach the bottom surface of the original etch stop layer 1200. As a result, the oxide layer 1300 formed after the thermal annealing process TA may be directly in contact with the sacrificial substrate 100', and a smooth interface may be seen between the oxide layer 1300 and the sacrificial substrate 100'. That is, the oxide layer 1300 is formed between the sacrificial substrate 100' and the remaining etch stop layer 1200. However, the disclosure is not limited thereto. In some alternative embodiments, the oxygen atoms OP do not reach the bottom surface of the original etch stop layer 1200, so the oxide layer 1300 formed is embedded in the remaining etch stop layer 1200. Such scenario is illustrated in FIG. 3. FIG. 3 is a schematic cross-sectional view illustrating an intermediate stage of a manufacturing process of the semiconductor device 20 in accordance with some alternative embodiments of the disclosure. Referring to FIG. 3, when the oxygen atoms OP do not reach the bottom surface of the original etch stop layer 1200, the resulting structure may have a stacking order of the sacrificial layer 100', a first etch stop layer 1200a (i.e. a bottom portion of the original etch stop layer 1200), an oxide layer 1300 (i.e. a layer obtained by oxidizing an intermediate portion of the original etch stop layer 1200), and a second etch stop layer 1200b (i.e. a top portion of the original etch stop layer 1200) from bottom to top. In some embodiments, a thickness of the first etch stop layer 1200a is significantly smaller than a thickness of the oxide layer 1300. Similarly, a thickness of the first etch stop layer 1200a is significantly smaller than a thickness of the second etch stop layer 1200b.

Conventionally, the formation of an oxide layer between a sacrificial substrate and an etch stop layer usually requires bonding of two different substrates (i.e. bonding a substrate with the sacrificial substrate and a substrate with the etch stop layer). However, such process is usually costly and requires accurate precision in bonding. As illustrated in FIG. 2C and FIG. 2D, the oxide layer 1300 is formed by oxidizing a portion of the etch stop layer 1200. Since the oxide layer 1300 can be formed by easily implanting oxygen atoms OP into the etch stop layer 1200 followed by performing a thermal annealing process TA, the fabrication cost may be effectively reduced and the process complexity may be sufficiently simplified.

Figure 2F:
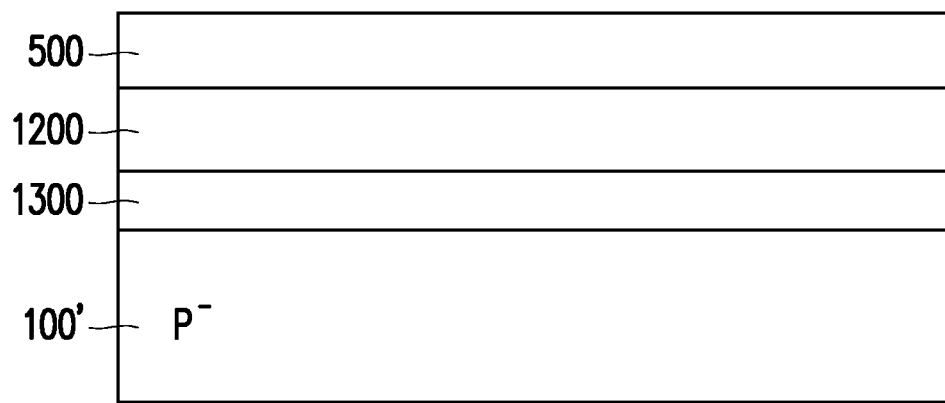

Referring to FIG. 2F, a capping layer 500 is formed on the etch stop layer 1200. The capping layer 500 in FIG. 2F is similar to the capping layer 500 in FIG. 1D, so the detailed description thereof is omitted herein. In some embodiments, the structure illustrated in FIG. 2F may be referred to as a SOI substrate.

Figure 2G:
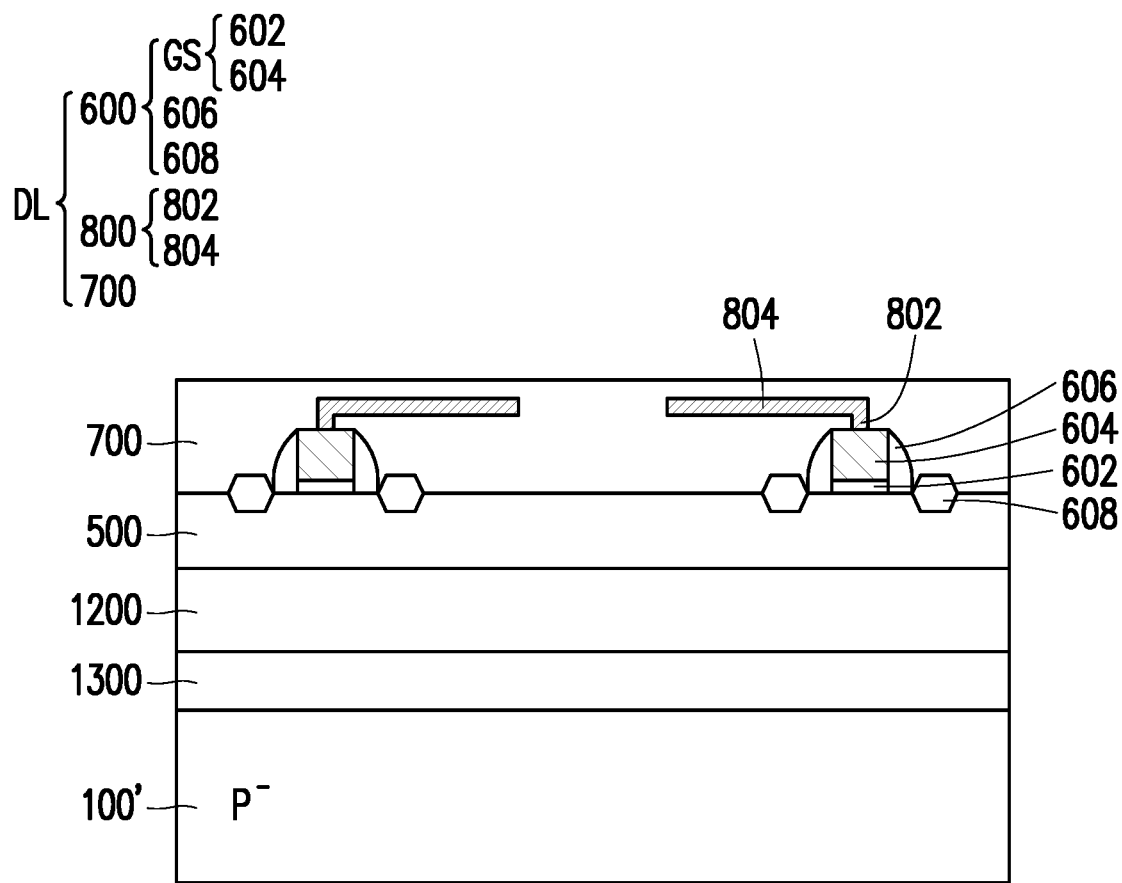

Referring to FIG. 2G, a device layer DL is formed on the capping layer 500. In some embodiments, the device layer DL includes transistors 600, a dielectric layer 700, and contact patterns 800. The device layer DL, the transistors 600, the dielectric layer 700, and the contact patterns 800 in FIG. 2G are respectively similar to the device layer DL, the transistors 600, the dielectric layer 700, and the contact patterns 800 in FIG. 1E, so the detailed descriptions thereof are omitted herein.

Figure 2H:
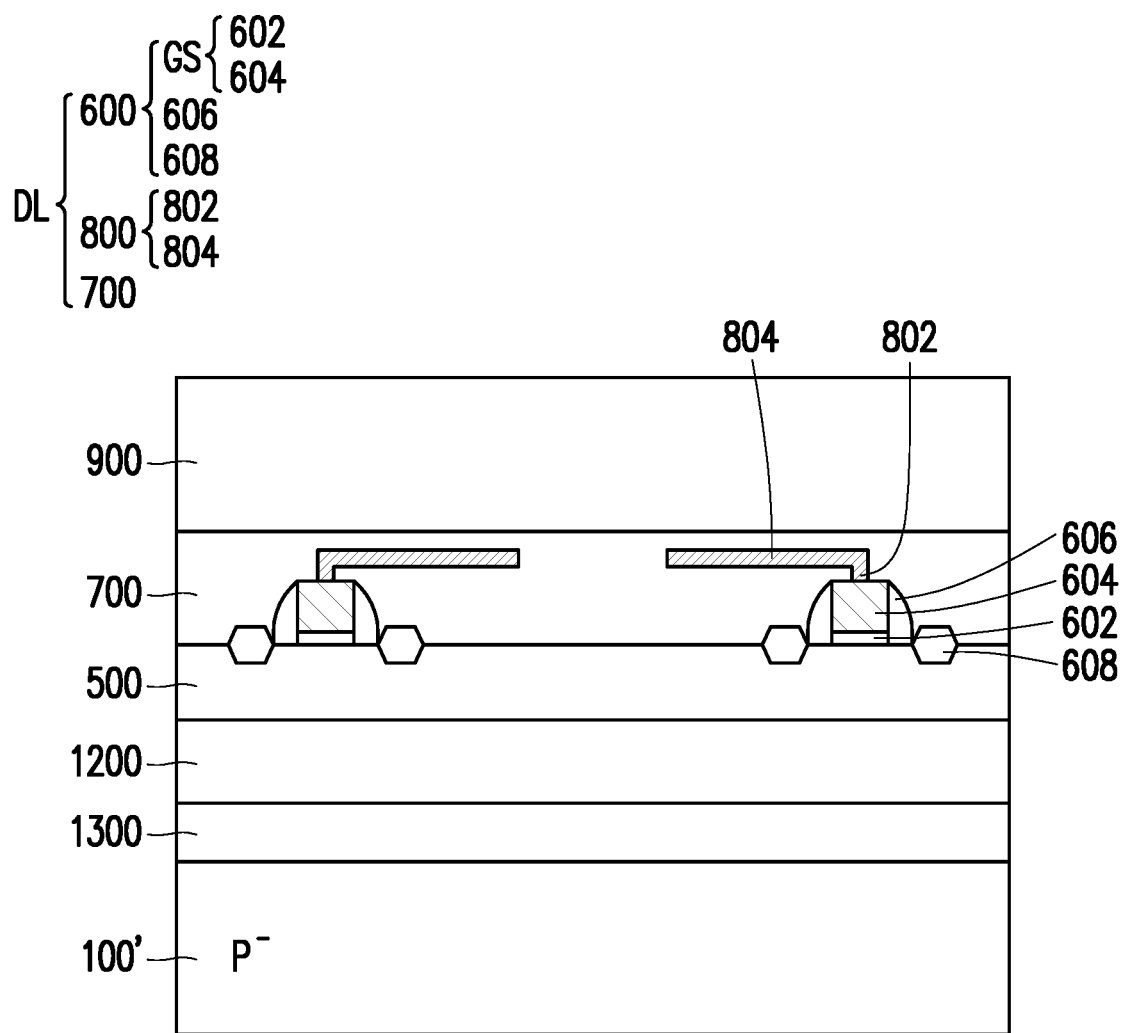

Referring to FIG. 2H, a handle substrate 900 is bonded to the device layer DL. The handle substrate 900 in FIG. 2H is similar to the handle substrate in FIG. 1F, so the detailed description thereof is omitted herein.

Figure 2I:
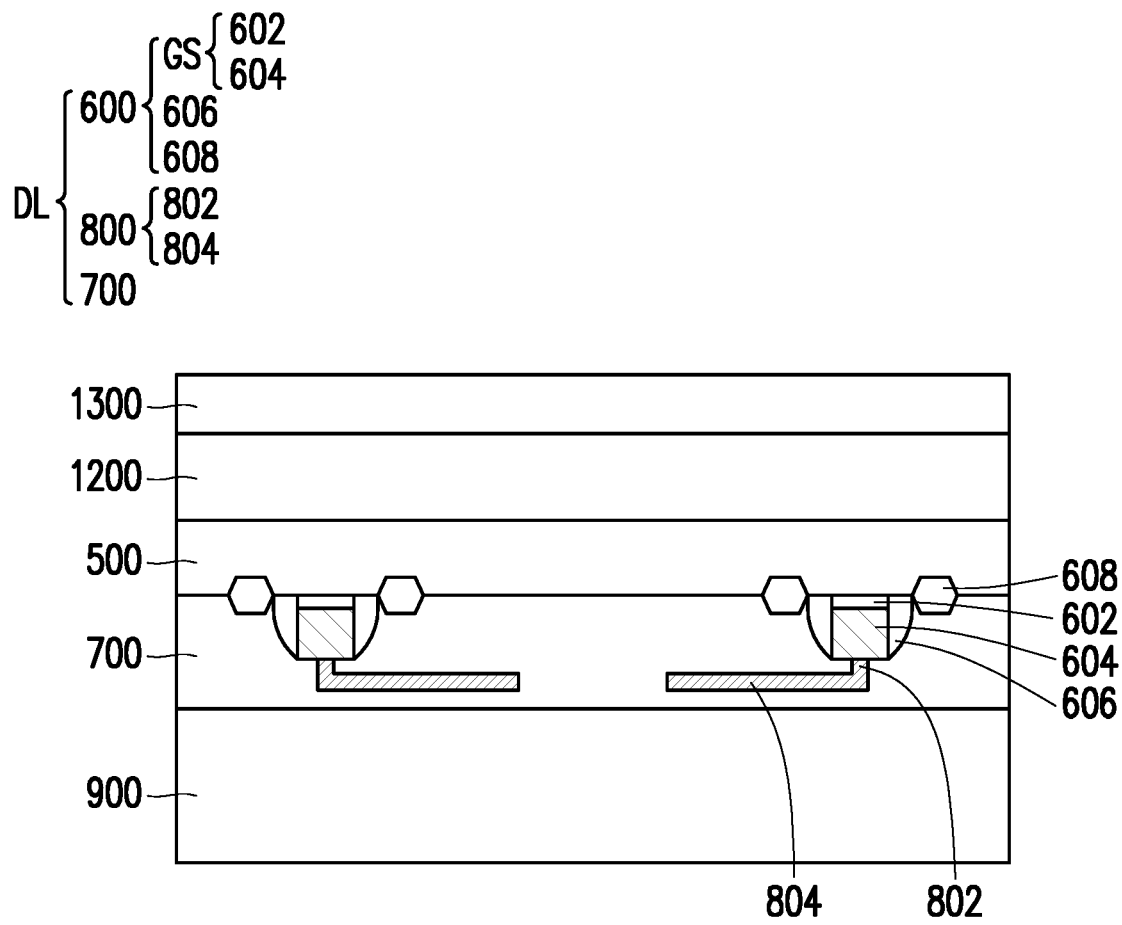

Referring to FIG. 2H and FIG. 2I, the structure illustrated in FIG. 2H is flipped upside down. Thereafter, a first etching process is performed on the sacrificial substrate 100' to remove the sacrificial substrate 100'. In some embodiments, the first etching process includes a dry etch process or a wet etch process. The dry etch process includes, for example, RIE, ICP etch, ECR etch, NBE, and/or the like. When the first etching process is a wet etching process, an etchant for removing the sacrificial layer 100' includes tetramethylammonium hydroxide (TMAH). In some embodiments, a chemical content of TMAH in the etchant is about 2% to about 3%. For example, the chemical content of TMAH in the etchant is about 2.38%. In some embodiments, the etchant for the first etching process has a first etch rate for materials of the sacrificial substrate 100' and a second etch rate for materials of the oxide layer 1300. In some embodiments, the second etch rate is less than the first etch rate. For example, the first etch rate is about 900 to about 1000 times greater than the second etch rate. As such, the oxide layer 1300 may serve as an etch stop layer for the first etching process. That is, the sacrificial substrate 100' may be completely removed while the oxide layer 1300 is barely damaged.

Figure 2J:
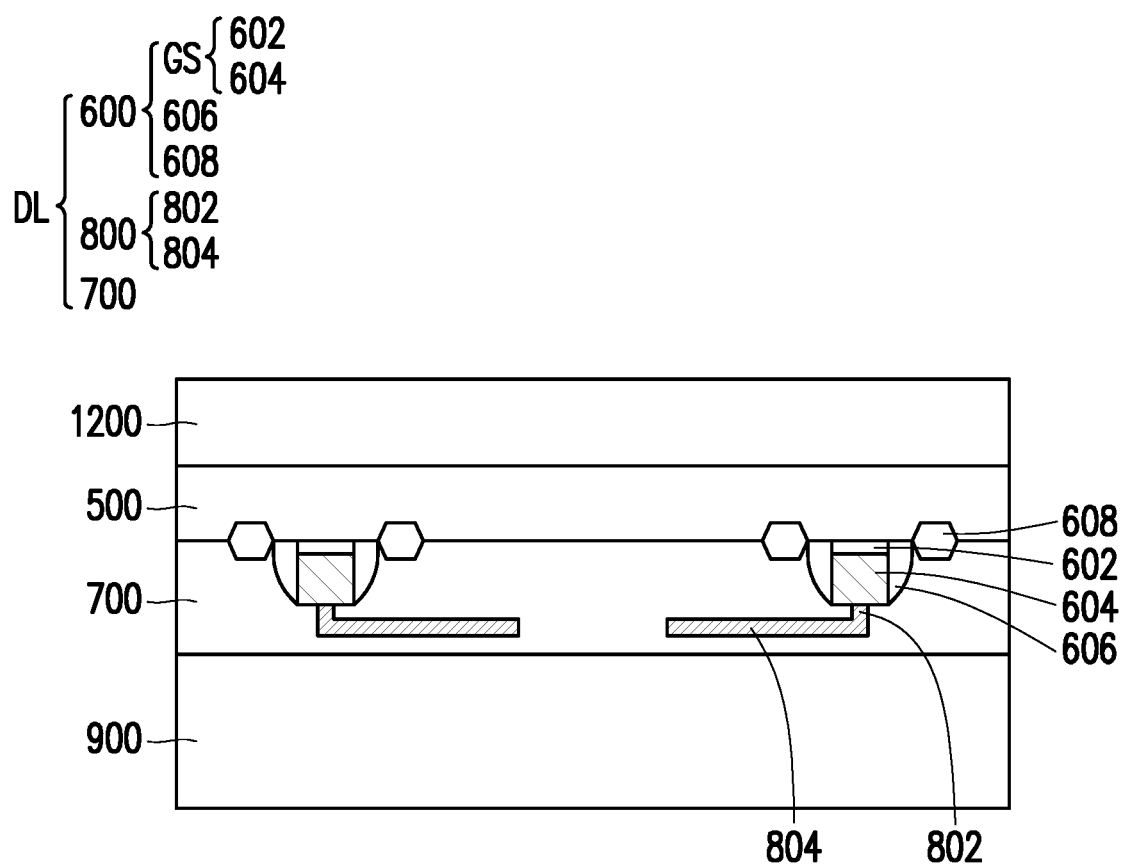

Referring to FIG. 2I and FIG. 2J, a second etching process is performed on the oxide layer 1300 to remove the oxide layer 1300. In some embodiments, the second etching process includes a dry etch process or a wet etch process. The dry etch process includes, for example, RIE, ICP etch, ECR etch, NBE, and/or the like. When the second etching process is a wet etching process, an etchant for removing the oxide layer includes diluted hydrofluoric acid (DHF). In some embodiments, in the DHF, a ratio of water to a ratio of hydrofluoric acid is about 100:1. In some embodiments, the etchant for the second etching process has a third etch rate for materials of the oxide layer 1300 and a fourth etch rate for materials of the etch stop layer 1200. In some embodiments, the fourth etch rate is less than the third etch rate. For example, the third etch rate is about 90 to about 100 times greater than the fourth etch rate. As such, the etch stop layer 1200 may serve as an etch stop layer for the second etching process. That is, the oxide layer 1300 may be completely removed while the etch stop layer 1200 is barely damaged.

Figure 2K:
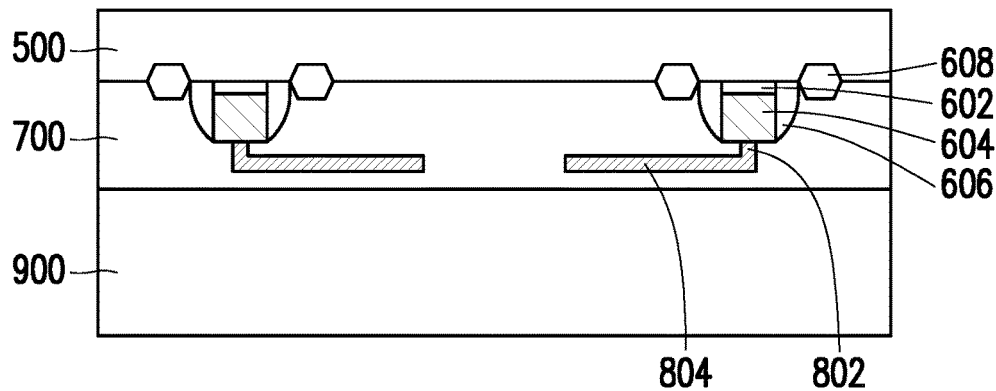

Referring to FIG. 2J and FIG. 2K, a third etching process is performed on the etch stop layer 1200 to remove the etch stop layer 1200. In some embodiments, the third etching process includes a dry etch process or a wet etch process. The dry etch process includes, for example, RIE, ICP etch, ECR etch, NBE, and/or the like. When the third etching process is a wet etching process, an etchant for removing the etch stop layer 1200 includes a combination of hydrofluoric acid (HF), hydrogen peroxide ($H_2O_2$), and acetic acid ($CH_3COOH$). In some embodiments, a ratio of HF:$H_2O_2$:$CH_3COOH$ is about 1:2:3. In some embodiments, the etchant for the third etching process has a fifth etch rate for materials of the etch stop layer 1200 and a sixth etch rate for materials of the capping layer 500. In some embodiments, the sixth etch rate is less than the fifth etch rate. For example, the fifth etch rate is about 50 to about 100 times greater than the sixth etch rate. As such, the capping layer 500 may serve as an etch stop layer for the third etching process. That is, the etch stop layer 1200 may be completely removed while the capping layer 500 is barely damaged.

In some embodiments, by adopting the three-step etching process with different etchants, the removal of the sacrificial layer 100', the oxide layer 1300, and the etch stop layer 1200 can be highly controlled. Therefore, the thickness of the capping layer 500 may be highly uniform across the capping layer 500 and a TTV of the capping layer 500 may be low. In some embodiments, the TTV of the capping layer 500 ranges from about 500 to about 1500 angstroms. That is, a top surface of the capping layer 500 as shown in FIG. 2K is substantially flat.

Figure 2L:
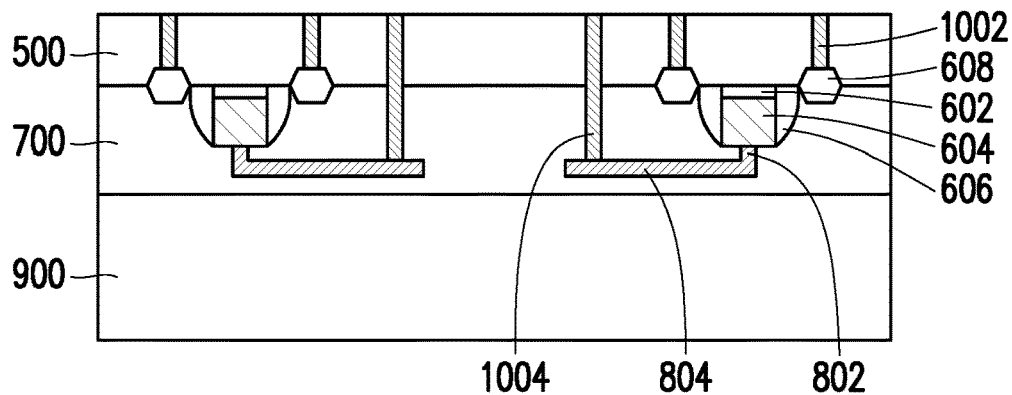

Referring to FIG. 2L, a plurality of conductive contacts 1002 is formed in the capping layer 500. Meanwhile, a plurality of conductive contacts 1004 is formed in the capping layer 500 and the dielectric layer 700. The conductive contacts 1002 and the conductive contacts 1004 in FIG. 2L are respectively similar to the conductive contacts 1002 and the conductive contacts 1004 in FIG. 1J, so the detailed descriptions thereof are omitted herein.

Figure 2M:
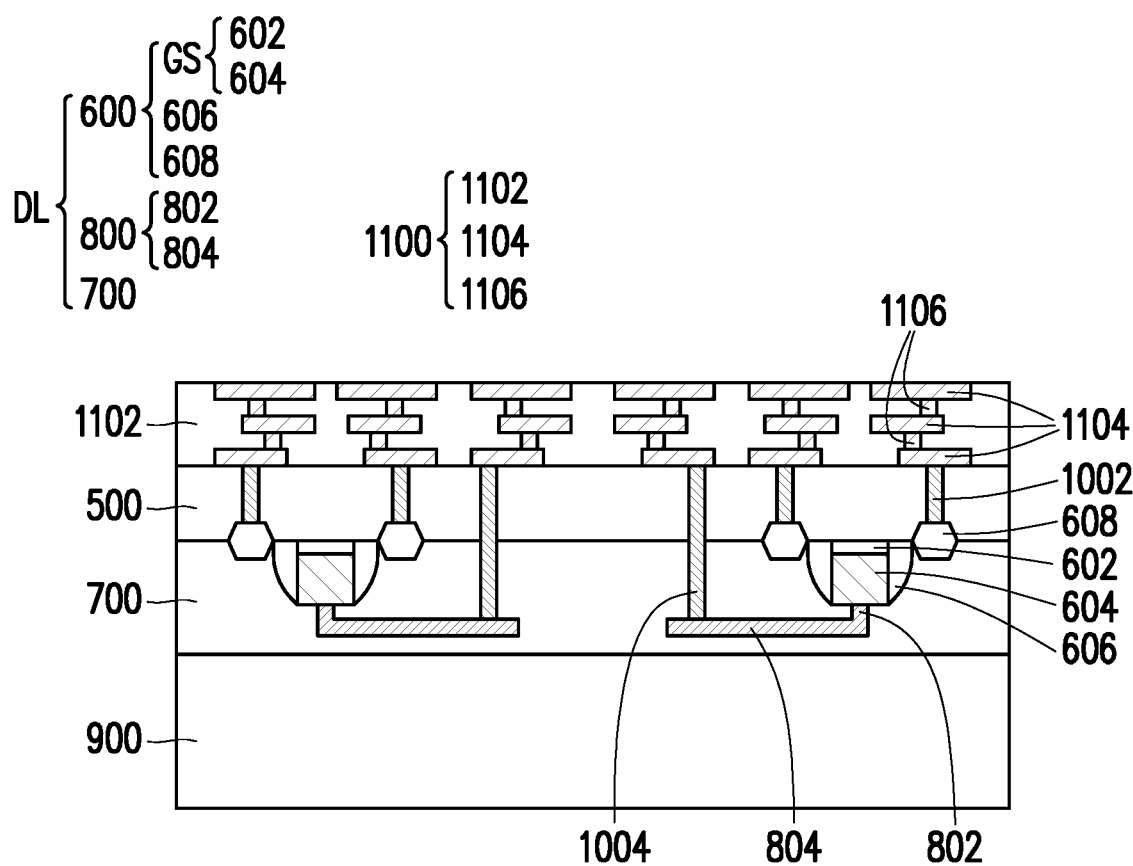

Referring to FIG. 2M, a power rail 1100 is formed on the capping layer 500 opposite to the device layer DL to obtain a semiconductor device 20. The power rail 1100 in FIG. 2M is similar to the power rail 1100 in FIG. 1K, so the detailed description thereof is omitted herein. In some embodiments, the power rail 1100 is used as a ground or a power source for the transistors 600.

In accordance with some embodiments of the disclosure, a manufacturing method of a semiconductor device includes the followings steps. A sacrificial substrate is provided. An epitaxial layer is formed on the sacrificial substrate. An etch stop layer is formed on the epitaxial layer. Carbon atoms are implanted into the etch stop layer. A capping layer and a device layer are formed on the etch stop layer. A handle substrate is bonded to the device layer. The sacrificial substrate, the epitaxial layer, and the etch stop layer having the carbon atoms are removed from the handle substrate.

In accordance with some alternative embodiments of the disclosure, a manufacturing method of a semiconductor device includes at least the following steps. A sacrificial substrate is provided. An etch stop layer is formed on the sacrificial substrate. A portion of the etch stop layer is oxidized to form an oxide layer between the sacrificial substrate and the remaining etch stop layer. A capping layer is formed on the remaining etch stop layer. A first etching process is performed to remove the sacrificial substrate. A second etching process is performed to remove the oxide layer. A third etching process is performed to remove the remaining etch stop layer. Etchants of the first etching process, the second etching process, and the third etching process are different.

In accordance with some alternative embodiments of the disclosure, a manufacturing method of a semiconductor device includes at least the following steps. A sacrificial substrate is provided. An etch stop layer is formed on the sacrificial substrate. Oxygen atoms are implanted into the etch stop layer. A thermal annealing process is performed to transform a lower portion of the etch stop layer into an oxide layer. A capping layer is formed on the etch stop layer. A device layer is formed on the capping layer. A handle substrate is bonded to the device layer. The sacrificial substrate, the oxide layer, and the etch stop layer are removed from the handle substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor device, comprising:
   providing a sacrificial substrate;
   forming an etch stop layer on the sacrificial substrate;
   oxidizing a portion of the etch stop layer to form an oxide layer between the sacrificial substrate and the remaining etch stop layer;
   forming a capping layer on the remaining etch stop layer;
   forming a device layer on the capping layer;
   performing a first etching process to remove the sacrificial substrate;
   performing a second etching process to remove the oxide layer;
   performing a third etching process to remove the remaining etch stop layer; and
   forming a power rail on the capping layer opposite to the device layer.

2. The method of claim 1, wherein the etch stop layer is formed of SiGe and the oxide layer is formed of $SiO_2$.

3. The method of claim 2, wherein a content of germanium in the etch stop layer ranges from about 20% to about 30%.

4. The method of claim 1, wherein an etchant for the first etching process comprises tetramethylammonium hydroxide (TMAH), an etchant for the second etching process comprises diluted hydrofluoric acid (DHF), and an etchant for the third etching process comprises a combination of hydrofluoric acid (HF), hydrogen peroxide ($H_2O_2$), and acetic acid ($CH_3COOH$).

5. A manufacturing method of a semiconductor device, comprising:
   providing a sacrificial substrate;
   forming an etch stop layer on the sacrificial substrate;
   implanting oxygen atoms into the etch stop layer, wherein the sacrificial substrate is spaced apart from the oxygen atoms;
   pushing the oxygen atoms down to reach a bottom surface of the etch stop layer, so as to transform a lower portion of the etch stop layer into an oxide layer;
   forming a capping layer on the etch stop layer; and
   removing the sacrificial substrate, the oxide layer, and the etch stop layer from the capping layer.

6. The method of claim 5, wherein the oxide layer is in physical contact with both the sacrificial substrate and the etch stop layer.

7. The method of claim 5, wherein a doping concentration of the oxygen atoms ranges from about $1\times10^{17}$ $cm^{-3}$ to about $3\times10^{17}$ $cm^{-3}$.

8. The method of claim 5, wherein pushing the oxygen atoms down comprises a thermal annealing process performed at a temperature ranging from about 1200 to about 1300° C.

9. The method of claim 5, further comprising:
   forming a device layer on the capping layer; and
   forming a power rail on the capping layer opposite to the device layer.

10. The method of claim 9, wherein forming the device layer comprises forming gate structures, and the method further comprises forming conductive contacts penetrating through the capping layer to electrically connect the power rail and the gate structures.

11. The method of claim 5, wherein removing the sacrificial substrate, the oxide layer, and the etch stop layer comprises:
    removing the sacrificial substrate by using tetramethylammonium hydroxide (TMAH);
    removing the oxide layer by using diluted hydrofluoric acid (DHF); and
    removing the etch stop layer by using a combination of hydrofluoric acid (HF), hydrogen peroxide ($H_2O_2$), and acetic acid ($CH_3COOH$).

12. The method of claim 11, wherein a ratio of HF:$H_2O_2$:$CH_3COOH$ is about 1:2:3.

13. A manufacturing method of a semiconductor device, comprising:
    providing a sacrificial substrate;
    forming an etch stop layer on the sacrificial substrate;
    transforming a portion of the etch stop layer into an oxide layer, wherein the oxide layer is in physical contact with the sacrificial substrate and the remaining etch stop layer; and
    sequentially removing the sacrificial substrate, the oxide layer, and the remaining etch stop layer.

14. The method of claim 13, wherein the etch stop layer is formed of SiGe and the oxide layer is formed of $SiO_2$.

15. The method of claim 14, wherein a content of germanium in the etch stop layer ranges from about 20% to about 30%.

16. The method of claim 13, wherein removing the sacrificial substrate, the oxide layer, and the remaining etch stop layer comprises:
   removing the sacrificial substrate by using tetramethylammonium hydroxide (TMAH);
   removing the oxide layer by using diluted hydrofluoric acid (DHF); and
   removing the remaining etch stop layer by using a combination of hydrofluoric acid (HF), hydrogen peroxide ($H_2O_2$), and acetic acid ($CH_3COOH$).

17. The method of claim 16, wherein a ratio of $HF:H_2O_2:CH_3COOH$ is about 1:2:3.

18. The method of claim 13, further comprising:
   forming a capping layer on the remaining etch stop layer;
   forming a device layer on the capping layer;
   bonding a handle substrate to the device layer; and
   forming a power rail on the capping layer opposite to the device layer after removing the sacrificial substrate, the oxide layer, and the remaining etch stop layer.

19. The method of claim 18, wherein forming the device layer comprises forming gate structures, and the method further comprises forming conductive contacts penetrating through the capping layer to electrically connect the power rail and the gate structures.

20. The method of claim 18, wherein forming the capping layer, forming the device layer, and bonding the handle substrate are performed before removing the sacrificial substrate, the oxide layer, and the remaining etch stop layer.

* * * * *